US008604886B2

(12) United States Patent
Nikonov et al.

(10) Patent No.: US 8,604,886 B2
(45) Date of Patent: Dec. 10, 2013

(54) SPIN TORQUE OSCILLATOR HAVING MULTIPLE FIXED FERROMAGNETIC LAYERS OR MULTIPLE FREE FERROMAGNETIC LAYERS

(75) Inventors: Dmitri E. Nikonov, Morgan Hill, CA (US); George I. Bourianoff, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 121 days.

(21) Appl. No.: 12/973,269

(22) Filed: Dec. 20, 2010

(65) Prior Publication Data

US 2012/0154063 A1    Jun. 21, 2012

(51) Int. Cl.
*H01L 29/82* (2006.01)
*H03B 28/00* (2006.01)

(52) U.S. Cl.
USPC ..... 331/94.1; 331/107 R; 331/187; 360/324.1

(58) Field of Classification Search
USPC ............... 331/94.1, 3; 428/810, 811.1, 811.2, 428/811.5; 360/324.2, 324.1, 324.12; 365/158, 171
See application file for complete search history.

(56) References Cited

U.S. PATENT DOCUMENTS

| | | | |
|---|---|---|---|
| 6,611,034 B2 | 8/2003 | Den | |
| 7,986,544 B2 * | 7/2011 | Kent et al. | 365/148 |
| 8,053,244 B2 * | 11/2011 | Ryan et al. | 436/149 |
| 2007/0076469 A1 | 4/2007 | Nakamura et al. | |
| 2009/0201614 A1 * | 8/2009 | Kudo et al. | 360/324.11 |

FOREIGN PATENT DOCUMENTS

| | | |
|---|---|---|
| JP | 2010206023 A * | 9/2010 |
| KR | 10-2010-0091158 | 8/2010 |
| KR | 10-2012-0021723 | 3/2012 |

OTHER PUBLICATIONS

Slavin, "Spin-torque oscillators get in phase", nature nanotechnology, vol. 4, Aug. 2009, pp. 479-480.*
International Searching Authority, "Notification of Transmittal of the International Search Report and the Written Opinion of the International Searching Authority," mailed Mar. 27, 2012, in International application No. PCT/US2011/063343.

\* cited by examiner

*Primary Examiner* — Ryan Johnson
(74) *Attorney, Agent, or Firm* — Trop, Pruner & Hu, P.C.

(57) ABSTRACT

A spin torque oscillator and a method of making same. The spin torque oscillator is configured to generate microwave electrical oscillations without the use of a magnetic field external thereto, the spin torque oscillator having one of a plurality of input nanopillars and a nanopillar having a plurality of free FM layers.

27 Claims, 6 Drawing Sheets

US 8,604,886 B2

SPIN TORQUE OSCILLATOR HAVING MULTIPLE FIXED FERROMAGNETIC LAYERS OR MULTIPLE FREE FERROMAGNETIC LAYERS

FIELD

Embodiments of the invention relate to spin torque oscillators.

BACKGROUND

Spin torque oscillators have been first demonstrated in the year 2003. See S. I. Kiselev et al., Nature 425, 380 (2003). Since then, they have been shown to provide a reliable option as microwave signal generators. They typically provide a smaller size than other microwave oscillators, and are defined mainly by the size of their ferromagnetic nanopillars, which typically have a size below about 200 nm. The frequency of a spin torque oscillator may be tuned by varying the current passed through the same. In general, the operation of spin torque oscillators relies on precession of magnetization in the free (or "active") ferromagnetic (FM) layer under the action of spin torque due to electrons crossing the non-magnetic layer (such as copper or MgO, for example) from the FM layer. The variation or precession of magnetization is then converted to an electric signal via the effect of magnetoresistance, which refers to the change in resistance of the stack of materials of the spin torque oscillator based on the relative orientations of magnetization in the free and fixed FM layers.

Currently, microwave oscillators based on nanomagnets and their precession by the spin torque effect require an external magnetic field for their operation. Under such circumstances, one would need either a permanent magnet or a wire with current in order to create an external magnetic field. In the case of a permanent magnet, however, disadvantageously, the spin torque oscillator would take additional space, and further, interference would be created with other parts of the circuit. In the case of a wire, the arrangement would lead to constantly dissipated Joule heat, which could be disadvantageous to the circuit.

BRIEF DESCRIPTION OF THE DRAWINGS

Some embodiments of the invention may be better understood by referring to the following description and accompanying drawings that are used to illustrate embodiments of the invention. In the drawings:

FIG. 1b is a top plan view of the spin torque oscillator of FIG. 1a;

FIG. 5b shows a top plan view of the spin torque oscillator of FIG. 5a;

DETAILED DESCRIPTION

Figure 1A:
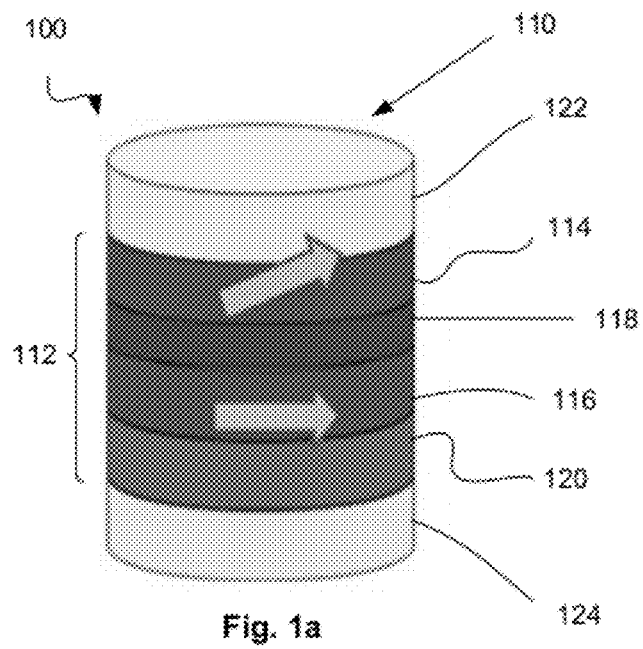
FIG. 1a is a perspective view of a spin torque oscillator according to the prior art.

In the following description, numerous specific details are set forth. However, it is understood that embodiments of the invention may be practiced without these specific details. In other instances, well-known circuits, structures and techniques have not been shown in detail in order not to obscure an understanding of this description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments are predicated on the well-known principle that a spin-polarized electrical current can apply a torque to a ferromagnet through direct transfer of spin angular momentum. Thus, a magnetic multilayer structure may convert energy for example from a direct electrical current into high-frequency magnetic rotations which may be applied in devices such as microwave oscillators. An example of a conventional device that achieves the above result is shown in FIGS. 1a and 1b, along with a supporting plot at FIG. 2.

Figure 1B:
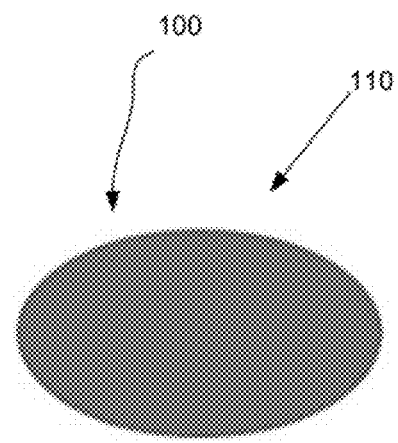

Referring in particular to FIGS. 1a and 1b, the nanopillar 110 of a conventional spin torque oscillator 100 is shown in side view and in top plan view, respectively. Nanopillar 110 includes a material stack 112 comprising a free ferromagnetic (FM) layer 114 separated from a fixed FM layer 116 by a non-magnetic layer 118. The FM layers may include any FM material, such as, for example, cobalt, a cobalt-iron alloy, or nickel-iron alloy, a cobalt-nickel alloy, or iron-platinum alloy. The FM layer 116 can be a multi-layer combination of several alloys. The non-magnetic layer 118 may for example include a non-magnetic metal such as copper; in this case the layers 114, 118 and 116 together are termed a "spin valve". Alternatively, the non-magnetic layer 118 may for example include a dielectric/non-magnetic material, such as aluminum oxide ($Al_2O_3$) or magnesium oxide (MgO); in this case the layers 114, 118 and 116 together are a "magnetic tunnel junction". A pinning anti-ferromagnetic layer (AFM layer) 120 is disposed such that the fixed FM layer is sandwiched between it and the non-magnetic layer. The role of the pinning AFM layer is to prevent the fixed FM layers from undergoing rotation as a result of spin transfer torque. The AFM layer may comprise any exchange material such as, for example, iron-manganese alloy or a platinum-manganese alloy Material stack is in turn sandwiched between a top electrode 122 and a bottom electrode 124 as shown. The electrodes may be made of any non-magnetic conductive material for example, such as copper or gold. For example, the free FM layer may include a 3 nm layer of Co, the non-magnetic layer may include a 3 nm layer of Cu, the fixed FM layer may include a 40 nm layer of Co, the pinning AFM layer may include a 20 nm layer of PtMn and the top and bottom electrode may include layers of Cu. In its shown elliptical cross section, the nanopillar 110 may have a long axis measuring about 130 nm and a short axis measuring about 70 nm. Transmission of electrons by way of direct current by virtue of a voltage applied across material stack 112 drives the electrons through the fixed FM layer 116 toward the non-magnetic layer, applying a torque to the free FM layer 114. An oscillation in the magnetization of the free FM layer 114 relative to that of the fixed FM layer 116 may result, changing the resistance of the nanopillar 110. Under direct current conditions, such magnetic dynamics produce a time-varying voltage, which in turn may generate a signal having a frequency in the microwave range. As best seen in FIG. 1b, the nanopillar is elliptical in cross section. Under such a configuration, the oscillations tend to be symmetric relative to the direction of the magnetization moment in the free FM layer 114. In such a case, voltage signals would occur only under two stable states of the free FM layer 114 as will be explained with respect to FIG. 2 below.

Figure 2:
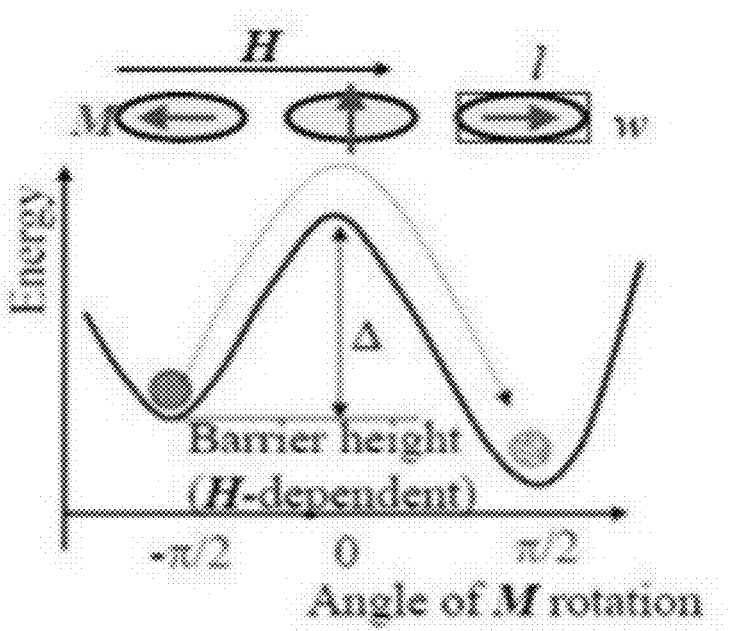
FIG. 2 is a plot of magnetization energy versus angle of magnetization in plane of a free FM layer in a spin torque oscillator of the prior art.

Referring next then to FIG. 2, a schematic plot of energy of a nanomagnet such as nanopillar 110 of FIGS. 1a and 1b is shown versus the angle of magnetization in plane of a free FM layer comparable to free FM layer 114. Two stable magnetization states exist for magnetization along the long axis of the ellipse marked "I" on the plot. An external magnetic field H is applied, the energy of one state becomes lower than that of the other as seen on the right hand side of FIG. 2. At a larger magnetic field, only one stable state may remain. Thus, referring back to FIG. 1, to ensure proper signal strength, an external magnetic field must be applied to the nanopillar 110 as shown by arrow H in order to leave a single state around which the magnetization in the free FM layer 114 can rotate.

Embodiments do away with the necessity of providing an external magnetic field H in order to ensure proper microwave signal strength from a spin torque oscillator. By a magnetic field that is "external" to a spin torque oscillator, what is meant is a magnetic field which is not generated by virtue of running a current through the spin torque oscillator. Thus, embodiments provide a spin torque oscillator comprising a nanopillar configured to generate microwave electrical oscillations without the use of a magnetic field external thereto. According to a first embodiment, the spin torque oscillator includes a plurality of nanopillars including an output nanopillar and at least two input nanopillars, wherein the nanopillars are insulated from one another and include respective fixed magnetic layers. The first embodiment allows independent currents to be injected through the input nanopillars, their values and/or polarities chosen to create an oscillating magnetic vortex by virtue of a spatially varying spin torque in the free FM layer generated by the independently injected input currents. One nanopillar may then be used for the output signal. According to a second embodiment, the spin torque oscillator has a substantially circular cross-section, is free of any pinning layer, and comprises a first free ferromagnetic layer and a tunnel junction disposed on the first free ferromagnetic layer, and a second free ferromagnetic layer different in at least one of thickness and saturation magnetization from the first free ferromagnetic layer, the second free ferromagnetic layer being disposed on the tunnel junction. Here again, an external magnetic field is not needed. One forms two free FM layers that lack the shape anisotropy provided by a free FM layer having an elliptical cross section. By virtue of the near circular cross sections thereof, the two free FM layers of the second embodiment lack preferred/lower energy states. Thus, the spatially varying magnetization is generated within the free FM layer without the need for an externally applied magnetic field.

The first and second embodiments will now be described in further detail below with respect to FIGS. 3a-4 and to FIGS. 5a-5c, respectively.

Figure 3A:
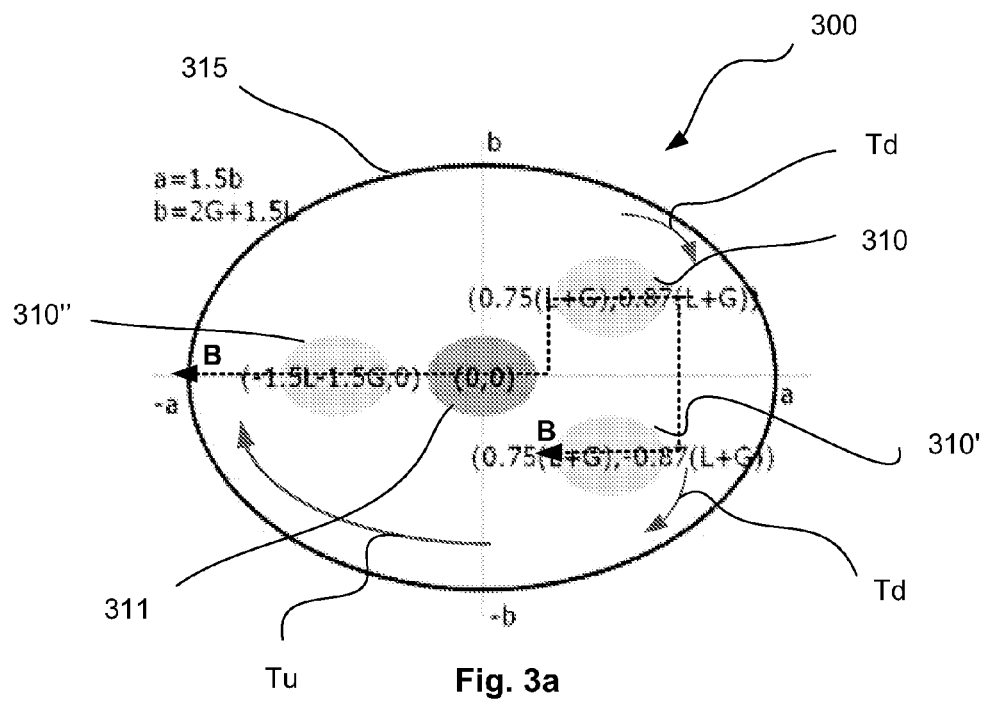
FIGS. 3a is a top plan view of a spin torque oscillator according to a first embodiment.
Figure 3B:
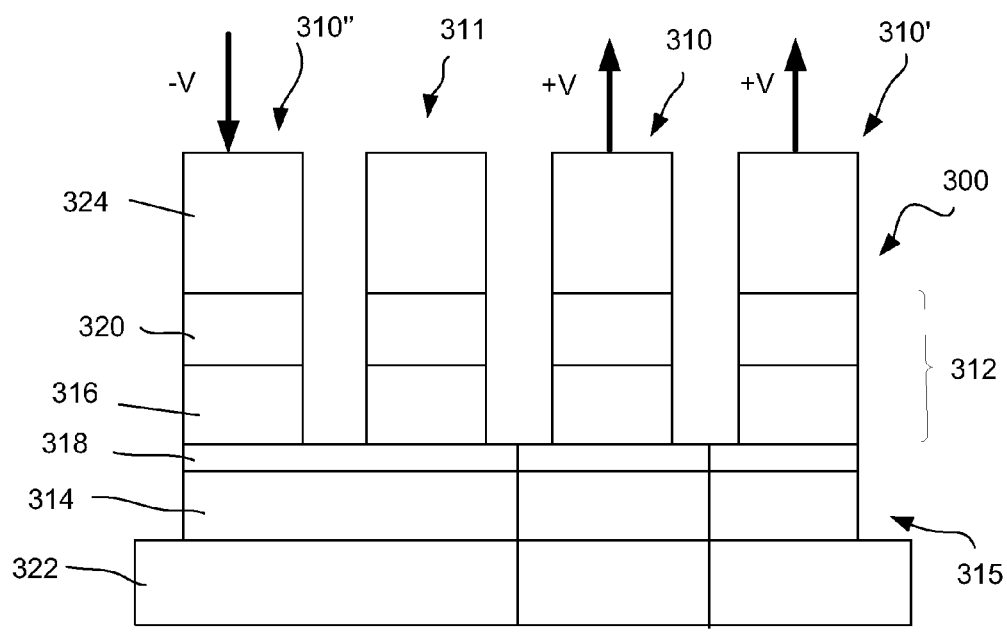
FIG. 3b is a cross section view of FIG. 3a along lines B-B.
Figure 4:
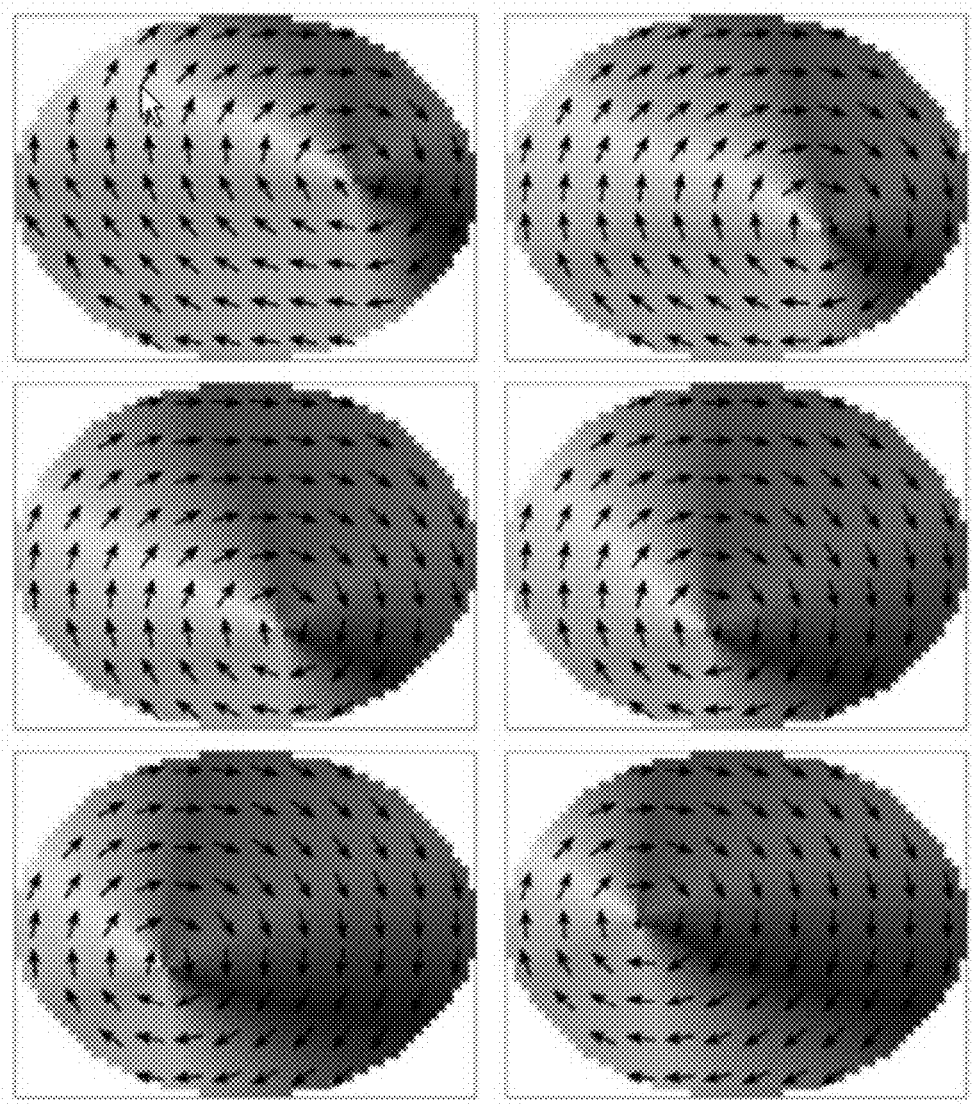
FIG. 4 depicts successive snapshots of simulated magnetizations in top plan view within a free FM layer according to the first embodiment.

Referring first to FIGS. 3a-4, an example is provided of a first embodiment. As seen in FIG. 3a, where a spin torque oscillator 300 according to a first embodiment is shown in top plan view. The exemplary spin torque oscillator 300 may include three input nanopillars 310, 310' and 310", and an output nanopillar 311 as shown, all disposed on a common base 315, although the first embodiment as described above may include two input nanopillars or more. Base 315, as may be best seen with reference to FIG. 3b, includes a non-magnetic layer 318 and a free FM layer 314 coextensive therewith. As seen in FIG. 3a, base 315 on the one hand, and input nanopillars 310, 310' and 310" on the other hand, may preferably have elliptical cross sections/elliptical top plan views. Elliptically shaped cross sections/top plan views for the nanopillars 310, 310', 310", and 311 ensure that the fixed FM layers 316 in them have the stable magnetization state along the long axis of the ellipse.

Referring next to FIG. 3b, a cross-sectional view is shown of the spin torque oscillator 300 of FIG. 3a along broken line B-B. As seen in FIG. 3b, the plurality of nanopillars 310, 310', 310" and 311 each include a material stack 312 comprising a fixed FM layer 316 and a pinning AFM layer 320 disposed on the fixed FM layer 316. The AFM layer may comprise, for example, a platinum-manganese alloy. The spin torque oscillator 300 further includes a non-magnetic layer 318 which may extend under all of the nanopillars 310, 310', 310" and 311, and a free FM layer 314 coextensive with the non-magnetic layer 118. The FM layers may include any FM material, such as, for example, cobalt, a cobalt-iron alloy, a nickel-iron alloy or a iron-platinum alloy. The non-magnetic layer 318 may for example include any dielectric/non-magnetic material, such as for example copper. According to one embodiment, the non-magnetic layer 318 may include a dielectric layer, such as, for example, MgO. Material stack 312 along with non-magnetic layer 318 and free FM layer 314 are sandwiched between a ground electrode 322 and respective top electrodes 324 above each material stack 312, the electrodes comprising for example non-magnetic metals such as copper, gold or platinum. The electrodes may be metal layers in an integrated circuit, for example a microprocessor, a microwave transceiver or sensor. In the shown embodiment, the magnetization of the free layer 314 is variable and in general spatially non-uniform by virtue of the positioning of the input nanopillars and the possibility of providing independent respective input currents thereto. Magnetization in the fixed layers 316 is kept constant by the adjacent pinning AFM layers 320. A transmission of electrons by way of direct independent currents into each of nanopillars 310, 310' and 310" by virtue of differing respective voltages to the same drives electrons through each respective fixed FM layer 316 toward or away from the non-magnetic layer, applying a torque to the free FM layer 114. The direction of the torque generated by each input nanopillar 310, 310' and 310" (whether clockwise or counterclockwise) depends on the direction of electron flux within the input nanopillar. Thus, where a positive voltage is applied to an input nanopillar, such as input nanopillars 310 and 310' in FIGS. 3a and 3b, the direction of electron flux within that input nanopillar will be away from the free FM layer, and the resultant magnetic torque within the free FM layer will be pointing downward, as shown by arrows Td in FIG. 3a. On the other hand, where a negative voltage is applied to an input nanopillar, such as input nanopillar 310" in FIGS. 3a and 3b, the direction of electron flux within that input nanopillar will be toward the free FM layer 314, and the resultant magnetic torque within the free FM layer will be pointing upward, as shown by arrow Tu in FIG. 3b. Thus, for each respective input nanopillar 310, 310' and 310", a respective component to an oscillation in the magnetization of the free FM layer 314 relative to that of the associated fixed FM layer 316 may result, each of those components being a function of the positioning of the input nanopillar and of the amount and/or polarity of current supplied thereto. Because of the differing input currents supplied to each of input nanopillar, the torque resulting from each within the free FM layer may be different, and hence an asymmetry in the precession within the free FM layer may be generated which results in a magnetic oscillation of the same. Such magnetic dynamics produce a time-varying voltage, which in turn may generate a signal having a frequency in the microwave range.

In the first embodiment of the invention, a positioning of respective nanopillars with respect to one another may be determined as a function of the desired pattern of magnetization change within the free FM layer. As suggested above, a positioning of input nanopillars may be determined by virtue of the torque direction that they may be desired to produced within the free FM layer. In general, the output nanopillar may preferably be disposed at a location corresponding to a largest magnetization change within the free FM layer. For example, if the magnetization within the free FM layer is to move in a vortex pattern, it may be preferable to place the output nanopillar at the center of the shape defined by the top plan view of the free FM layer as the center position corresponds to a location corresponding to a largest magnetization change within the free FM layer.

According to one embodiment, as suggested for example in FIG. 3a, the input nanopillars 310, 310' and 310" may be disposed to surround the output nanopillar 311. Coordinates of the centers of the pillars, as well as dimensions of the base layer 315, are indicated in FIG. 3a in terms of the minimum width of the pillar L, and minimum gap between the pillars G. Thus, in the shown example, base layer 315 may have a major radius a and minor radius given by equations (1) and (2) below:

$$a = 1.5b \quad \text{Eq. (1)}$$

$$b = 2G + 1.5L \quad \text{Eq. (2)}$$

In addition, nanopillars 310, 310' and 310" in the shown example have x coordinates of their centers given by the following equations (3), (4) and (5) below:

$$x(310) = 0.75(L+G) \quad \text{Eq. (3)}$$

$$x(310') = 0.75(L+G) \quad \text{Eq. (4)}$$

$$x(310'') = -1.5L \quad \text{Eq. (5)}$$

Nanopillars 310, 310' and 310" in the shown example have y coordinates of their centers given by the following equation (6), (7) and (8) below:

$$y(310) = 0.87(L+G) \quad \text{Eq. (6)}$$

$$y(310') = -0.87(L+G) \quad \text{Eq. (7)}$$

$$y(310'') = 0 \quad \text{Eq. (8)}$$

Also shown in FIG. 3a the spin torques Td and Tu in the free FM layer disposed under the nanopillars 310, 310' and 310" indicate the overall direction of rotation that promotes creation of a magnetic vortex. According to the first embodiment, the proposed arrangement of the input nanopillars surrounding the output nanopillar, and the polarity of the current passed through the input nanopillars (two positive and one negative direction of the current) will combine into a rotating pattern of magnetization change, and will promote the formation of the shown vortex.

FIGS. 4 shows successive snapshots from left to right and from top row to bottom row of simulated magnetization directions in top plan view within a free FM layer such as free FM layer 314 of FIGS. 3a and 3b taken within intervals of 0.1 ns. The images indicate that the position of the vortex V rotates around the center of the nanomagnet, which, for the shown simulation, was chosen to be an elliptic cylinder 210 nm×140 nm×3 nm with a current of 4 mA in each nanopillar, the three nanopillars have polarities of applied voltages and hence the polarities of the currents as indicated in FIG. 3b. In an example, voltage of magnitude of 4 volts is applied to each pillar. The simulations show that the center of a vortex will move in an elliptic orbit around the center of the ellipse. Thus the direction of magnetization under the output pillar will rotate and the resistance of the material stack will oscillate accordingly. Application of voltage to the output pillar will result in an oscillating output current with a frequency of the order of 1-10 GHz. Voltage of, for example 0.5 volts, is applied to the output pillar.

Figure 5A:
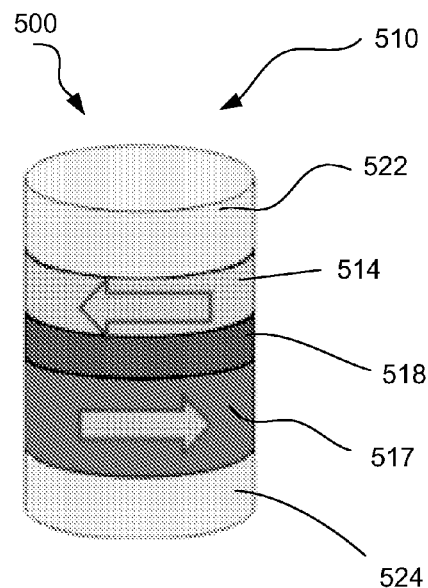
FIG. 5a shows a perspective view of a spin torque oscillator according to a second embodiment.
Figure 5B:
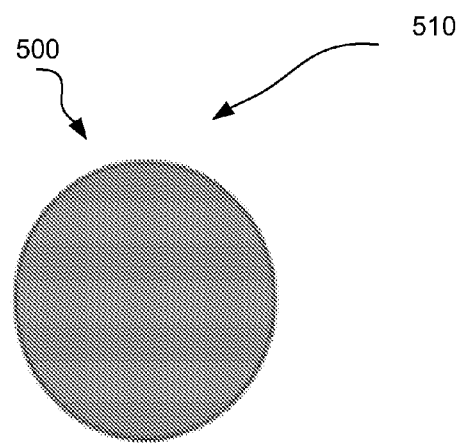
Figure 5C:
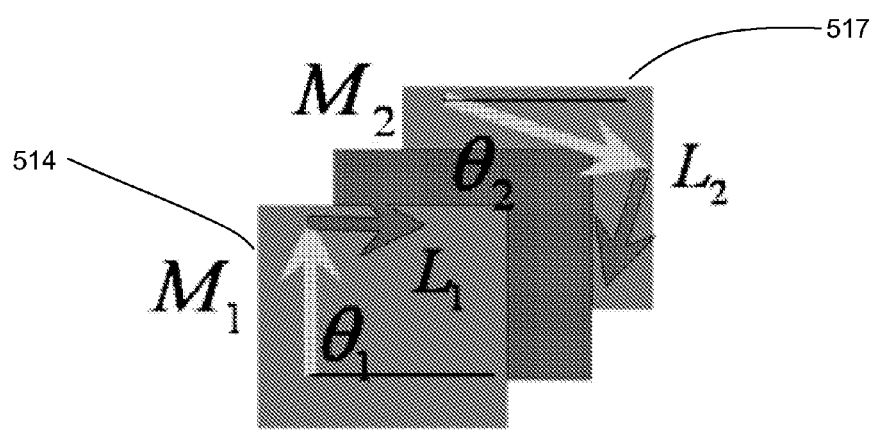
FIG. 5c shows magnetization schemes on two free ferromagnetic layers according to the second embodiment.

Referring next to FIGS. 5a-5c, an example of a second embodiment is shown. As seen in FIGS. 5a and 5b, a nanopillar 510 of a spin torque oscillator 500 is shown in side view and in top plan view, respectively. Nanopillar 510 includes a material stack 112 comprising a first free ferromagnetic (FM) layer 514 separated from a second free FM layer 517 by a non-magnetic layer 518 layer. According to the second embodiment, the two free FM layers have differing thicknesses and/or differing magnetization saturation values. Saturation magnetization value is the limit of magnetization value achieved for magnetized ferromagnet at low temperature. The FM layers may include any FM material, such as, for example, cobalt, a cobalt-iron alloy, a nickel-iron alloy or a iron-platinum-iron alloy. The non-magnetic layer 518 may for example include any dielectric/non-magnetic material, such as copper or MgO. Material stack is in turn sandwiched between a top electrode 522 and a bottom electrode 524 as shown. The electrodes may be made of any non-magnetic conductive material for example, copper or gold, and may correspond to metal lines in an integrated circuit. In the second embodiment, no pinning AFM layers are present, and therefore no fixed FM layers exist. In addition, by virtue of a near circular cross section of the nanopillar 510, no stable configurations exist. A transmission of electrons by way of direct current by virtue of a voltage applied across material stack 512 drives the electrons through the first free FM layer 514 and second free FM layer 517, applying a torque to each of the free FM layers. Both of the free FM layers precess, albeit with different angular velocities by virtue of their differing thicknesses and/or differing saturation magnetization values.

Referring next to FIG. 5b, the nanopillar is nearly circular in cross section. Under such a configuration, there are no lower energy configurations/stable magnetic states, by virtue of the lack of shape anisotropy as would exist in an elliptical cross section, for example. Under direct current conditions, by virtue of the changing of the relative angle of the two magnetizations generated in the respective free FM layers 514 and 517, microwave electrical oscillations may be generated in the voltage across nanopillar 510, since the resistance of the material stack 512 will vary with the relative angle of magnetizations.

A simulation regarding the second embodiment as shown by way of example in FIGS. 5a and 5b has been performed. The Landau-Lifshitz-Gilbert equations for the evolution of magnetization in two free FM layers (written here in the approximation of a uniform magnetization in each layer) are:

$$\frac{dM_1}{dt} = -\gamma[M_1 \times B] + \frac{\alpha}{M_s}\left[M_1 \times \frac{dM_1}{dt}\right] - \frac{\gamma\hbar P_2 J}{2M_{s1}^2 M_{s2} e t_1 \cdot g(\theta)}[M_1 \times [M_1 \times M_2]] \qquad \text{Eq. (9)}$$

Where B is magnetic field equal to zero for this example, $M_{1,2}$ is the magnetization in each layer, $M_{s1,2}$ is the saturation magnetization in each layer, $t_{1,2}$ is the thickness of each layer, $\theta = \theta_1 - \theta_2$ is the difference of angles of magnetizations for each layer, J is the current density, $P_{1,2}$ is the spin polarization of carriers for each layer. Therefore if both layers are free, the difference of the magnetization angles evolves as:

$$\frac{d\theta}{dt} = \frac{\gamma\hbar J \sin\theta}{2eg(\theta)}\left(\frac{P_2}{t_1 M_1} - \frac{P_1}{t_2 M_2}\right) \qquad \text{Eq. (10)}$$

It is this difference that determines the resistance of the stack in terms of resistances of the parallel and anti-parallel configurations:

$$R = R_p(1+\cos\theta)/2 + R_{ap}(1-\cos\theta)/2 \qquad \text{Eq. (11)}$$

We have concluded based on the above that the angle evolves in a quasi-harmonic fashion. Thus the resistance of the stack oscillates. The frequency of oscillations is proportional to the current. This enables a very efficient tuning via the current value, unlike the conventional oscillator explained above. The reason for it is that the conventional spin torque oscillator relies on eigen-frequencies of the magnetization modes in the nanomagnet, while with respect to embodiments the oscillations are driven by the current.

Referring to FIG. 5c, a scheme of magnetizations is shown acting on the two free FM layers denoted M1 and M2 (slightly off-set for clarity), which could correspond for example to free FM layers 514 and 517 of FIG. 5a. As seen in FIG. 5c, the arrow denoted with $\theta_{1,2}$'s correspond to the direction of magnetization, and the arrows marked $T_{1,2}$ correspond to the torques acting on respective ones of the layers. FIG. 5c shows among others that the magnetizations in the respective layers may have different magnitudes and directions, and that the torques generated in respective layers are a function of the magnetizations.

Figure 6:
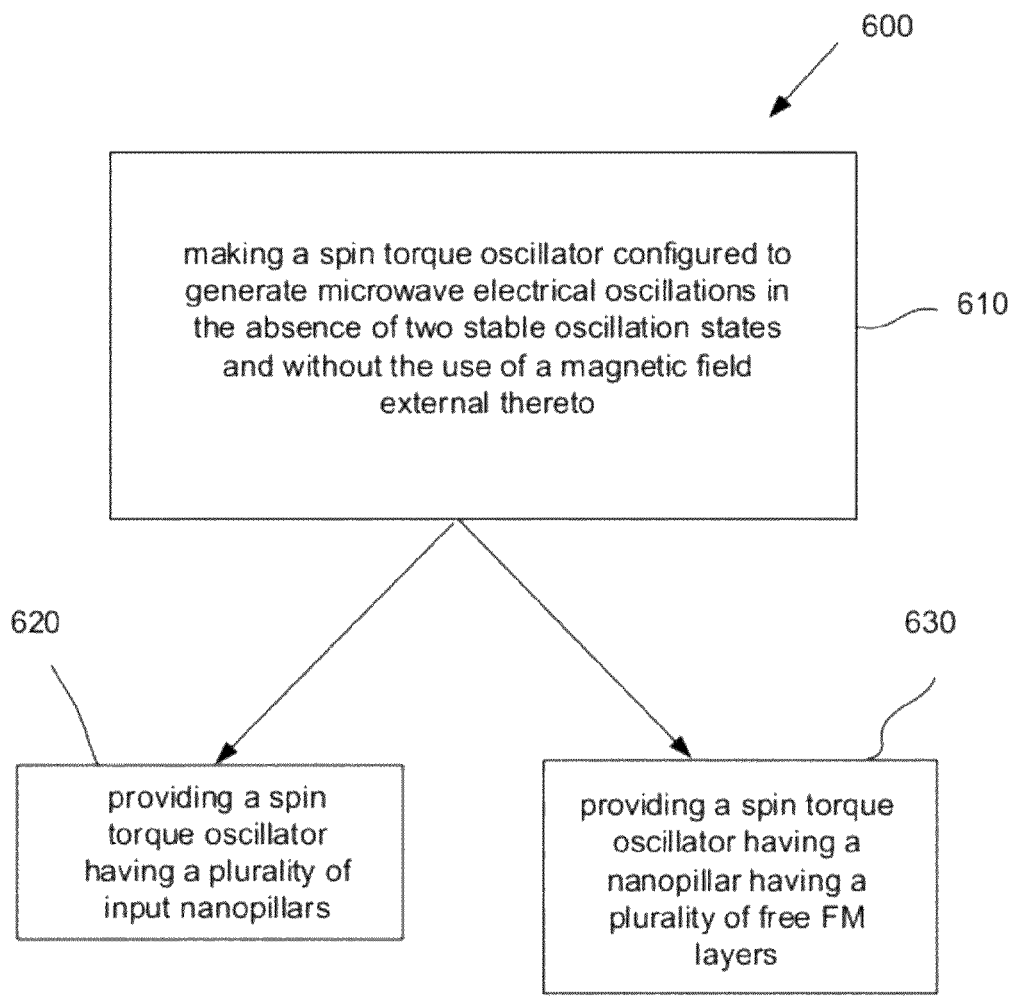
FIG. 6 is a flowchart showing a method according to embodiments.

Referring next to FIG. 6, a method embodiment is depicted in flowchart format. A method embodiment 600 at block 610 includes making a spin torque oscillator configured to generate microwave electrical oscillations in the absence of two stable oscillation states and without the use of a magnetic field external thereto. Making a spin torque oscillator according to embodiments may include, as shown at block 620 providing a spin torque oscillator having a plurality of input nanopillars or it may include, as shown at block 630, providing a spin torque oscillator having a nanopillar having a plurality of free FM layers.

Figure 7:
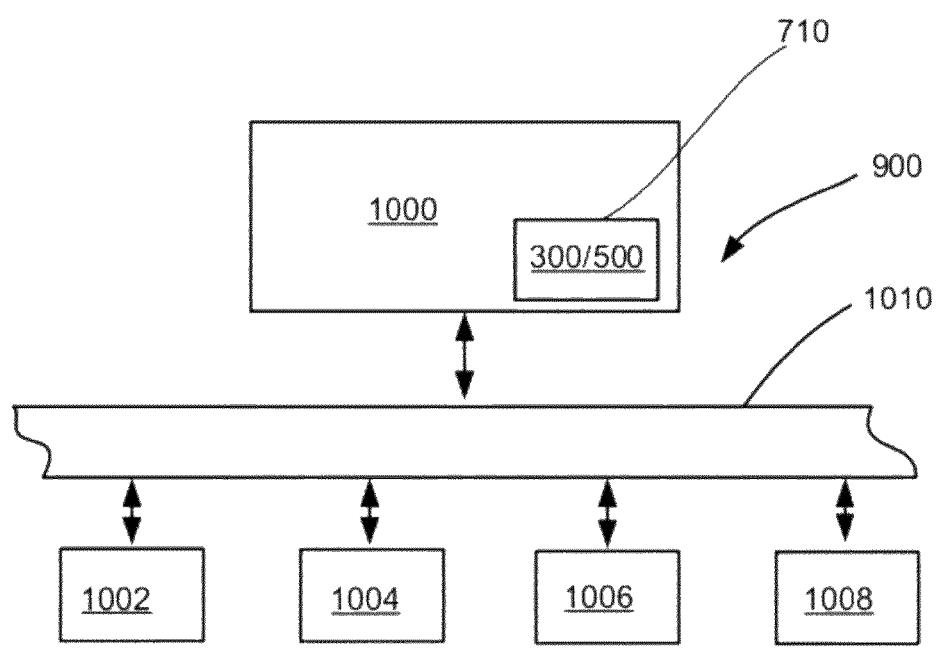
FIG. 7 is a system incorporating a spin torque oscillator according to embodiments.

Referring to FIG. 7, there is illustrated one of many possible systems 900 in which embodiments of the present invention may be used. In one embodiment, the electronic arrangement 1000 may include an integrated circuit 710 including a spin torque oscillator, such as oscillator 300 or 500 of FIGS. 3a-3b or 5a-5b. Arrangement 1000 may further include a microprocessor, a transceiver chip, or a sensor chip. In an alternate embodiment, the electronic arrangement 1000 may include an application specific IC (ASIC). Integrated circuits found in chipsets (e.g., graphics, sound, and control chipsets) may also be packaged in accordance with embodiments of this invention.

For the embodiment depicted by FIG. 7, the system 900 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth.

Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 900 may be a wireless mobile phone, a personal digital assistant, a pocket PC, a tablet PC, a notebook PC, a desktop computer, a set-top box, a media-center PC, a DVD player, and a server.

Advantageously, according to embodiments, a very compact and low power microwave spin torque oscillator may be created that does not require the use of an external magnetic field, in this way not only saving space and power, but further minimizing interference with other parts of the circuit and minimizing the dissipation of Joule heat. Such spin torque oscillators may be used to decrease the power of clocking and of transmitting wireless devices, thereby extending the battery lifetime of portable computing devices. According to the first embodiment, advantageously, a spin torque oscillator may be provided that allow a tuning of the frequency and direction magnetic oscillations therein by adjusting voltage polarity and amount. With respect to the second embodiment, additionally, a wider tunability of oscillation frequency is afforded by the multiple free FM layer design. Moreover, doing away with a pinning FM layer advantageously lowers fabrication costs and the chance of failures.

The foregoing description is intended to be illustrative and not limiting. Variations will occur to those of skill in the art. Those variations are intended to be included in the various embodiments of the invention, which are limited only by the scope of the following claims.

What is claimed is:

1. A spin torque oscillator configured to generate microwave electrical oscillations without the use of a magnetic field external thereto, the spin torque oscillator comprising:
   a plurality of input nanopillars;
   a free FM layer;
   a tunnel junction disposed on the free FM layer;
   wherein the plurality of nanopillars are insulated from one another and disposed on the tunnel junction, the plurality of nanopillars further including an output nanopillar and respective fixed magnetic layers.

2. The spin torque oscillator of claim 1, wherein the plurality of nanopillars comprise three input nanopillars.

3. The spin torque oscillator of claim 1, wherein the input nanopillars are disposed to surround the output nanopillar.

4. The spin torque oscillator of claim 2, wherein two of the three input nanopillars are adapted to direct current of one polarity, and one of the three input nanopillars is adapted to direct current of a polarity opposite to the one polarity.

5. The spin torque oscillator of claim 1, wherein the nanopillars further include respective anti-ferromagnetic pinning layers disposed on corresponding ones of the respective fixed magnetic layers.

6. The spin torque oscillator of claim 1, wherein the nanopillars have elliptical cross-sections.

7. The spin torque oscillator of claim 1, wherein the free FM layer has an elliptical cross-section.

8. The spin torque oscillator of claim 1, further comprising:
a ground electrode disposed under the free FM layer; and
respective electrodes disposed on corresponding ones of respective pinning layers included in the nanopillars.

9. The spin torque oscillator of claim 1, wherein the tunnel junction includes at least one of copper, aluminum oxide, and magnesium oxide.

10. A method of making a spin torque oscillator configured to generate microwave electrical oscillations without the use of a magnetic field external thereto, comprising:
providing a spin torque oscillator having a plurality of input nanopillars;
providing a free FM layer;
providing a tunnel junction disposed on the free FM layer;
insulating the plurality of nanopillars from one another;
disposing the plurality of nanopillars on the tunnel junction, the plurality of nanopillars further including an output nanopillar and respective fixed magnetic layers.

11. The method of claim 10, wherein the plurality of nanopillars comprise three input nanopillars.

12. The method of claim 10, further comprising disposing the input nanopillars to surround the output nanopillar.

13. The method of claim 11, further comprising configuring two of the three input nanopillars to direct current of one polarity, and configuring one of the three input nanopillars to direct current of a polarity opposite to the one polarity.

14. The method of claim 10, wherein providing a spin torque oscillator further comprises providing respective anti-ferromagnetic pinning layers for each of the nanopillars on corresponding ones of the respective fixed magnetic layers thereof.

15. The method of claim 10, wherein the nanopillars have elliptical cross-sections.

16. The method of claim 10, wherein the free FM layer has an elliptical cross-section.

17. The method of claim 14, wherein providing a spin torque oscillator further comprises:
providing a ground electrode disposed under the free FM layer;
providing respective electrodes disposed on corresponding ones of respective pinning layers included in the nanopillars.

18. The method of claim 10, wherein the tunnel junction includes at least one of copper, aluminum oxide, and magnesium oxide.

19. A system comprising an integrated circuit including:
a device layer;
a plurality of inter-layer dielectric layers disposed on the device layer;
a plurality of metal lines interleaved between the inter-layer dielectric layers;
a spin torque oscillator disposed between two of the plurality of metal lines such that the metal lines correspond to electrodes thereof, the spin torque oscillator being configured to generate microwave electrical oscillations without the use of a magnetic field external thereto, the spin torque oscillator having:
a plurality of input nanopillars;
a free FM layer; and
a tunnel junction disposed on the free FM layer;
wherein the plurality of nanopillars are insulated from one another and disposed on the tunnel junction, the plurality of nanopillars further including an output nanopillar and respective fixed magnetic layers.

20. The system of claim 19, wherein the plurality of nanopillars comprise three input nanopillars.

21. The system of claim 19, wherein the input nanopillars are disposed to surround the output nanopillar.

22. The system of claim 20, wherein two of the three input nanopillars are adapted to direct current of one polarity, and one of the three input nanopillars is adapted to direct current of a polarity opposite to the one polarity.

23. The system of claim 19, wherein the nanopillars further include respective anti-ferromagnetic pinning layers disposed on corresponding ones of the respective fixed magnetic layers.

24. The system of claim 19, wherein the nanopillars have elliptical cross-sections.

25. The system of claim 19, wherein the free FM layer has an elliptical cross-section.

26. The system of claim 19, further comprising:
a ground electrode disposed under the free FM layer;
respective electrodes disposed on corresponding ones of respective pinning layers included in the nanopillars.

27. The system of claim 19, wherein the tunnel junction includes at least one of copper, aluminum oxide, and magnesium oxide.

* * * * *